United States Patent
Embleton et al.

(10) Patent No.: US 11,147,194 B2
(45) Date of Patent: Oct. 12, 2021

(54) SYSTEM AND METHOD FOR MANAGING ELECTROMAGNETIC INTERFERENCE

(71) Applicant: Dell Products L.P., Hopkinton, MA (US)

(72) Inventors: Steven Embleton, Austin, TX (US); Ben John Sy, Austin, TX (US); Eric Michael Tunks, Austin, TX (US); James Don Curlee, Round Rock, TX (US); Joshua S. Keup, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/547,501

(22) Filed: Aug. 21, 2019

(65) Prior Publication Data
US 2021/0059082 A1 Feb. 25, 2021

(51) Int. Cl.
*H05K 9/00* (2006.01)
*H05K 5/04* (2006.01)
*H05K 5/02* (2006.01)

(52) U.S. Cl.
CPC ........ *H05K 9/0009* (2013.01); *H05K 5/0217* (2013.01); *H05K 5/04* (2013.01); *H05K 9/0062* (2013.01)

(58) Field of Classification Search
CPC .. H05K 9/0009; H05K 9/0062; H05K 5/0217; H05K 5/04
See application file for complete search history.

(56) References Cited

U.S. PATENT DOCUMENTS

| | | |
|---|---|---|
| 4,785,136 A | 11/1988 | Mollet et al. |
| 4,858,309 A | 8/1989 | Korsunsky et al. |
| 4,871,220 A | 10/1989 | Kohin |
| 5,049,701 A | 9/1991 | Vowles et al. |
| 5,084,802 A | 1/1992 | Nguyenngoc |
| 5,250,752 A * | 10/1993 | Cutright ............... H05K 9/0062 174/363 |
| 5,294,748 A | 3/1994 | Schwenk et al. |
| 5,323,298 A | 6/1994 | Shatas et al. |
| 5,437,560 A | 8/1995 | Mizuguchi |
| 5,545,844 A | 8/1996 | Plummer, III et al. |

(Continued)

OTHER PUBLICATIONS

Cary Fenical; "Rule-of-Thumb for Calculating Aperture Size"; Laird Technologies; Mar. 2003 (http://cdn.lairdtech.com/home/brandworld/files/EMI%20Rule-of-Thumb%20for%20Calculating%20Aperture%20Size%20Technical%20Note%20Download.pdf).

(Continued)

*Primary Examiner* — Hung S. Bui
*Assistant Examiner* — Sagar Shrestha
(74) *Attorney, Agent, or Firm* — Chamberlain, Hrdlicka, White, Williams & Aughtry

(57) ABSTRACT

A housing device for isolating electromagnetic interference emitting devices includes a structural frame. The structural frame of the housing device is for housing the electromagnetic interference emitting devices. The housing device further includes an electromagnetic interference isolating enclosure. The electromagnetic interference isolating enclosure of the housing device is non-structural. The electromagnetic interference isolating enclosure of the housing device is for encapsulating the structural frame.

14 Claims, 11 Drawing Sheets

(56) References Cited

U.S. PATENT DOCUMENTS

| | | | |
|---|---|---|---|
| 5,545,845 A * | 8/1996 | Flores | H05K 7/183 |
| | | | 174/374 |
| 5,649,831 A | 7/1997 | Townsend | |
| 5,762,513 A | 6/1998 | Stine | |
| 5,812,370 A | 9/1998 | Moore et al. | |
| 5,943,218 A | 8/1999 | Liu | |
| 6,011,221 A | 1/2000 | Lecinski et al. | |
| 6,038,130 A | 3/2000 | Boeck et al. | |
| 6,045,385 A | 4/2000 | Kane | |
| 6,068,009 A | 5/2000 | Paes et al. | |
| 6,176,727 B1 | 1/2001 | Liu et al. | |
| 6,208,514 B1 | 3/2001 | Stark et al. | |
| 6,225,554 B1 | 5/2001 | Frehan et al. | |
| 6,242,690 B1 | 6/2001 | Glover | |
| 6,269,001 B1 | 7/2001 | Matteson et al. | |
| 6,331,940 B1 | 12/2001 | Lin | |
| 6,332,792 B1 | 12/2001 | Lin et al. | |
| 6,370,036 B1 | 4/2002 | Boe | |
| 6,377,451 B1 | 4/2002 | Furuya | |
| 6,437,987 B1 | 8/2002 | Lin | |
| 6,517,369 B1 | 2/2003 | Butterbaugh et al. | |
| 6,613,977 B1 | 9/2003 | Fowler | |
| 6,657,214 B1 | 12/2003 | Foegelle et al. | |
| 6,695,630 B1 | 2/2004 | Ku | |
| 6,870,092 B2 | 3/2005 | Lambert et al. | |
| 6,947,290 B2 | 9/2005 | Hirata | |
| 7,035,087 B2 | 4/2006 | Tan | |
| 7,075,796 B1 | 7/2006 | Pritchett | |
| 7,133,296 B2 | 11/2006 | Choi et al. | |
| 7,287,996 B1 | 10/2007 | Shing | |
| 7,371,097 B1 | 5/2008 | Packer et al. | |
| 7,371,977 B1 | 5/2008 | Preonas | |
| 7,692,934 B2 | 4/2010 | Bartscher et al. | |
| 7,695,313 B2 | 4/2010 | Karim et al. | |
| 7,757,847 B2 | 7/2010 | Tang et al. | |
| 8,059,414 B2 | 11/2011 | Wei | |
| 8,098,492 B2 | 1/2012 | Rosenberg et al. | |
| 8,243,469 B2 | 8/2012 | Jaze et al. | |
| 8,310,834 B2 | 11/2012 | Fürholzer | |
| 8,508,956 B2 * | 8/2013 | Nicol | H05K 9/0054 |
| | | | 361/818 |
| 8,530,756 B1 | 9/2013 | Winch | |
| 8,636,526 B2 | 1/2014 | Funamura et al. | |
| 8,642,900 B2 | 2/2014 | Nordling et al. | |
| 8,662,295 B2 | 3/2014 | Kubota et al. | |
| 8,687,374 B2 | 4/2014 | Watanabe et al. | |
| 8,720,682 B2 | 5/2014 | Navon et al. | |
| 8,760,859 B2 | 6/2014 | Fuchs et al. | |
| 8,969,738 B2 | 3/2015 | Ross | |
| 9,019,711 B2 | 4/2015 | Tamura | |
| 9,095,045 B2 | 7/2015 | Rojo et al. | |
| 9,370,132 B2 | 6/2016 | Coppola | |
| 9,497,894 B1 | 11/2016 | Ramsey | |
| 9,549,480 B1 | 1/2017 | Besterman | |
| 9,585,270 B2 | 2/2017 | Yang et al. | |
| 9,603,280 B2 | 3/2017 | Frank et al. | |
| 9,607,660 B2 | 3/2017 | Bennett, II et al. | |
| 9,640,910 B1 | 5/2017 | Chien et al. | |
| 9,642,290 B2 | 5/2017 | Anderson et al. | |
| 9,820,404 B1 | 11/2017 | Wu et al. | |
| 9,829,939 B1 | 11/2017 | Lien et al. | |
| 9,930,816 B2 | 3/2018 | Winch et al. | |
| 10,007,309 B1 | 6/2018 | Imwalle | |
| 10,249,984 B1 | 4/2019 | Rask | |
| 10,364,031 B2 | 7/2019 | Goupil | |
| 10,420,258 B1 * | 9/2019 | Rahilly | H05K 9/0016 |
| 10,477,740 B2 | 11/2019 | Coppola | |
| 10,477,741 B1 | 11/2019 | Bae et al. | |
| 10,492,324 B2 | 11/2019 | Miura | |
| 10,520,532 B2 | 12/2019 | Lee | |
| 10,541,519 B1 | 1/2020 | Wavering | |
| 10,542,642 B2 | 1/2020 | Babhadiashar et al. | |
| 10,575,443 B2 | 2/2020 | Woodbury, II et al. | |
| 10,638,634 B1 * | 4/2020 | Elsasser | H05K 9/0062 |
| 10,707,636 B2 | 7/2020 | Yamamoto | |
| 10,720,722 B2 | 7/2020 | Tsomg et al. | |
| 10,734,763 B2 | 8/2020 | M R et al. | |
| 10,980,159 B2 * | 4/2021 | Embleton | H04L 1/0002 |
| 2002/0000645 A1 | 1/2002 | Sato et al. | |
| 2002/0001181 A1 | 1/2002 | Kondo | |
| 2002/0027769 A1 | 3/2002 | Kasahara et al. | |
| 2002/0064035 A1 | 5/2002 | Mair et al. | |
| 2003/0011988 A1 * | 1/2003 | Irmer | H02B 1/50 |
| | | | 361/690 |
| 2003/0057131 A1 | 3/2003 | Diaferia | |
| 2003/0137811 A1 | 7/2003 | Ling et al. | |
| 2003/0174474 A1 | 9/2003 | Mair et al. | |
| 2003/0174487 A1 | 9/2003 | Garmong | |
| 2005/0247471 A1 * | 11/2005 | Archambeault | H05K 9/0081 |
| | | | 174/388 |
| 2006/0025010 A1 | 2/2006 | Spitaels et al. | |
| 2007/0105445 A1 | 5/2007 | Manto et al. | |
| 2007/0145699 A1 * | 6/2007 | Robbins | H05K 7/18 |
| | | | 280/47.26 |
| 2007/0147013 A1 * | 6/2007 | Robbins | H05K 7/183 |
| | | | 361/759 |
| 2007/0151779 A1 * | 7/2007 | Robbins | G06F 1/16 |
| | | | 180/65.1 |
| 2008/0076291 A1 | 3/2008 | Ewing et al. | |
| 2009/0021925 A1 | 1/2009 | Heimann | |
| 2009/0095523 A1 | 4/2009 | Stevenson | |
| 2009/0146862 A1 | 6/2009 | Malone | |
| 2010/0117579 A1 | 5/2010 | Culbert | |
| 2010/0208433 A1 * | 8/2010 | Heimann | H04Q 1/03 |
| | | | 361/724 |
| 2010/0270299 A1 * | 10/2010 | Baltussen | H01L 21/6719 |
| | | | 220/4.33 |
| 2010/0285636 A1 | 11/2010 | Chen | |
| 2010/0319981 A1 | 12/2010 | Kapusta et al. | |
| 2011/0011760 A1 | 1/2011 | Habersetzer | |
| 2011/0198245 A1 | 8/2011 | Soufan | |
| 2011/0222249 A1 | 9/2011 | Ruehl et al. | |
| 2011/0232956 A1 | 9/2011 | Ramsey | |
| 2012/0011700 A1 | 1/2012 | Kelaher et al. | |
| 2012/0044653 A1 | 2/2012 | Morris et al. | |
| 2012/0073873 A1 | 3/2012 | Nash | |
| 2012/0116590 A1 | 5/2012 | Florez-Iarrahondo | |
| 2012/0178364 A1 | 7/2012 | Dobyns | |
| 2012/0285738 A1 | 11/2012 | Cochrane et al. | |
| 2013/0032310 A1 * | 2/2013 | Jaena | F28D 15/02 |
| | | | 165/104.25 |
| 2013/0160563 A1 | 6/2013 | Dingler et al. | |
| 2013/0194772 A1 * | 8/2013 | Rojo | H04Q 1/116 |
| | | | 361/818 |
| 2013/0206470 A1 | 8/2013 | Davis | |
| 2013/0258582 A1 | 10/2013 | Shelnutt | |
| 2013/0277520 A1 | 10/2013 | Funk et al. | |
| 2014/0008119 A1 * | 1/2014 | Brandt | H05K 9/0073 |
| | | | 174/382 |
| 2014/0138388 A1 | 5/2014 | Synnestvedt | |
| 2014/0368821 A1 | 12/2014 | Gazaway et al. | |
| 2015/0014912 A1 | 1/2015 | Ivey et al. | |
| 2015/0245529 A1 | 8/2015 | Tam et al. | |
| 2015/0257310 A1 | 9/2015 | Desouza | |
| 2015/0271959 A1 | 9/2015 | Chen et al. | |
| 2015/0368423 A1 | 12/2015 | Yamauchi et al. | |
| 2015/0373869 A1 | 12/2015 | Macerini et al. | |
| 2016/0081231 A1 | 3/2016 | Berke | |
| 2016/0111814 A1 | 4/2016 | Hirano et al. | |
| 2016/0159480 A1 | 6/2016 | Barth | |
| 2016/0182130 A1 | 6/2016 | Ahmed et al. | |
| 2016/0372948 A1 | 12/2016 | Kvols | |
| 2016/0381818 A1 * | 12/2016 | Mills | H05K 5/0217 |
| | | | 361/724 |
| 2017/0347496 A1 | 11/2017 | Smith | |
| 2018/0062287 A1 | 3/2018 | Shaw et al. | |
| 2018/0257334 A1 | 9/2018 | Motoyanagi et al. | |
| 2019/0008079 A1 | 1/2019 | Kondo et al. | |
| 2019/0050030 A1 | 2/2019 | Baum | |
| 2019/0056439 A1 * | 2/2019 | Lee | G10K 11/002 |
| 2019/0159371 A1 | 5/2019 | Grinsteinner | |
| 2019/0230828 A1 | 7/2019 | Murch | |
| 2019/0304922 A1 | 10/2019 | Maruthamuthu et al. | |

(56) References Cited

U.S. PATENT DOCUMENTS

| | | | |
|---|---|---|---|
| 2019/0320796 A1* | 10/2019 | Ding | A47B 47/021 |
| 2019/0353356 A1 | 11/2019 | Fischer | |
| 2019/0364701 A1* | 11/2019 | Rahilly | H05K 9/0015 |
| 2019/0379183 A1 | 12/2019 | Winsor | |
| 2020/0187394 A1 | 6/2020 | Murugesan | |
| 2020/0187578 A1 | 6/2020 | Sadato | |
| 2020/0313584 A1* | 10/2020 | Morel | H02K 35/00 |

OTHER PUBLICATIONS

"Full HD Endoscopes"; joimax® GmbH, May 1, 2019; https://web.archive.org/web/20190501003355/https://www.ioimax.com/en/products/electronic-devices/hd_endoscopes/.

"JRE 0814 RF Shielded Test Enclosure"; JRE Test, LLC, Apr. 22, 2019; https://web.archive.org/web/20190422094016/https://jretest.com/product/jre-0814/.

"Tapster"; Tapster Robotics, Inc., Sep. 30, 2017; https://web.archive.org/web/20170930111059/https://www.tapster.io/.

* cited by examiner

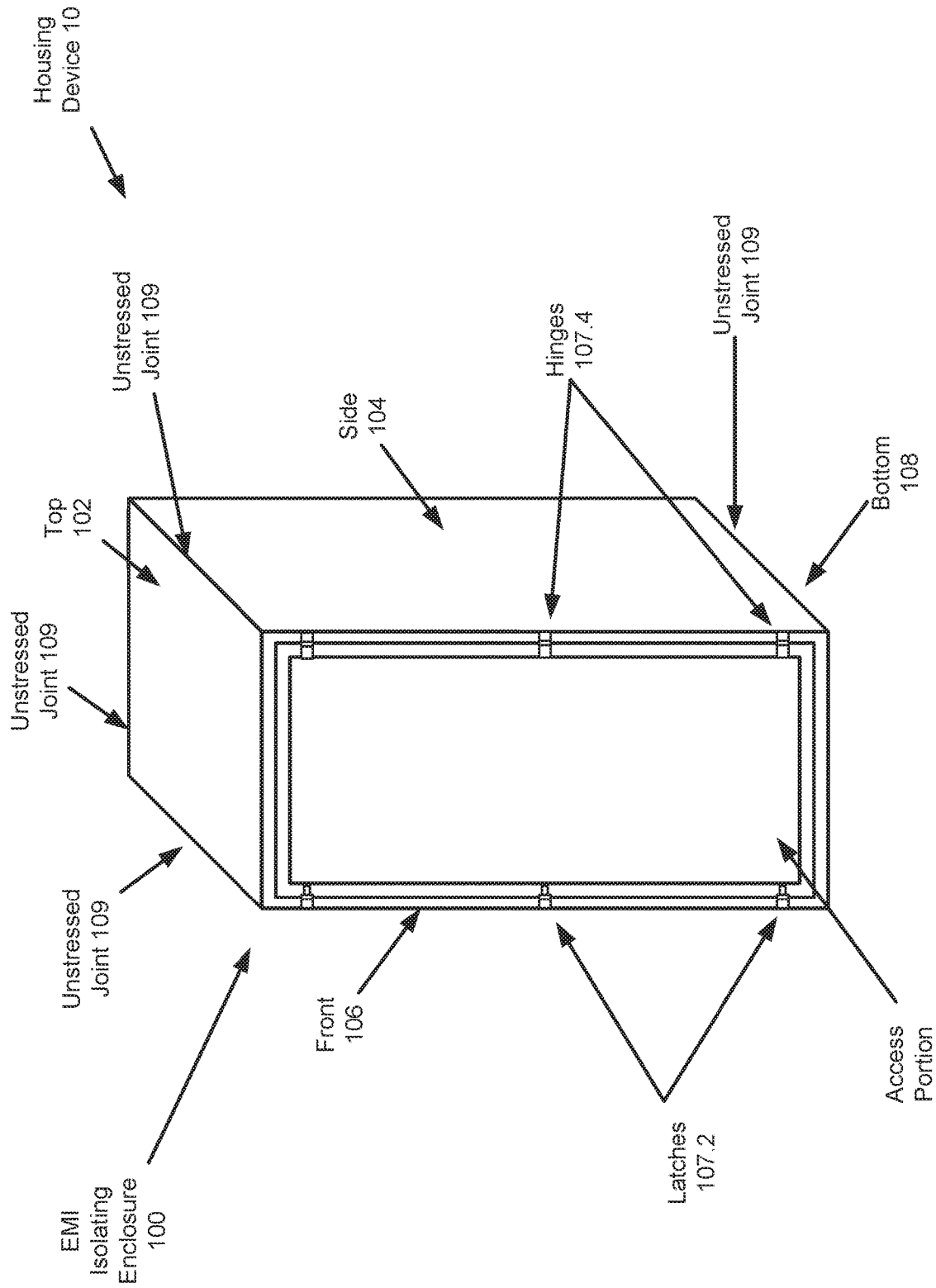
FIG. 1.1

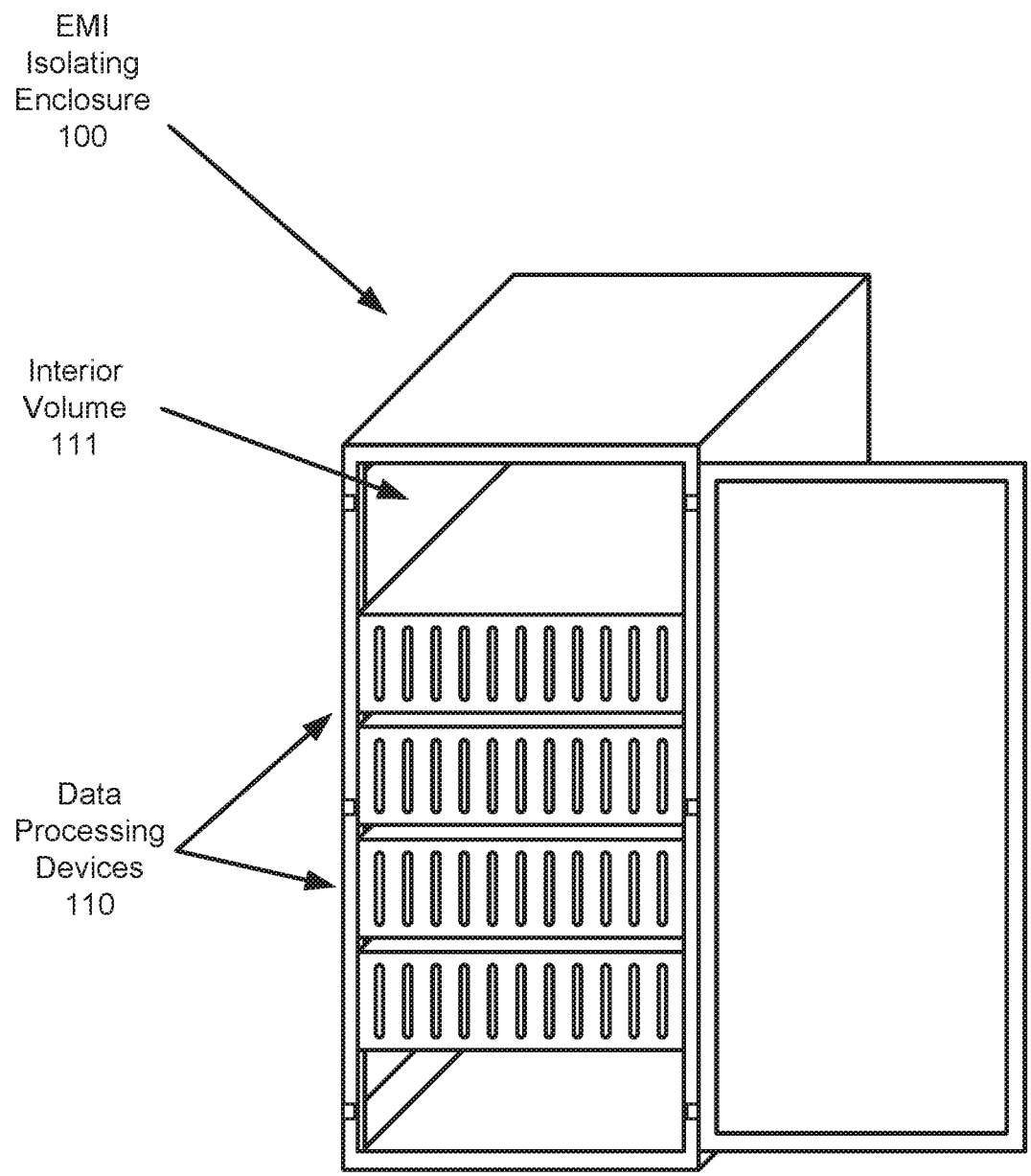
FIG. 1.2

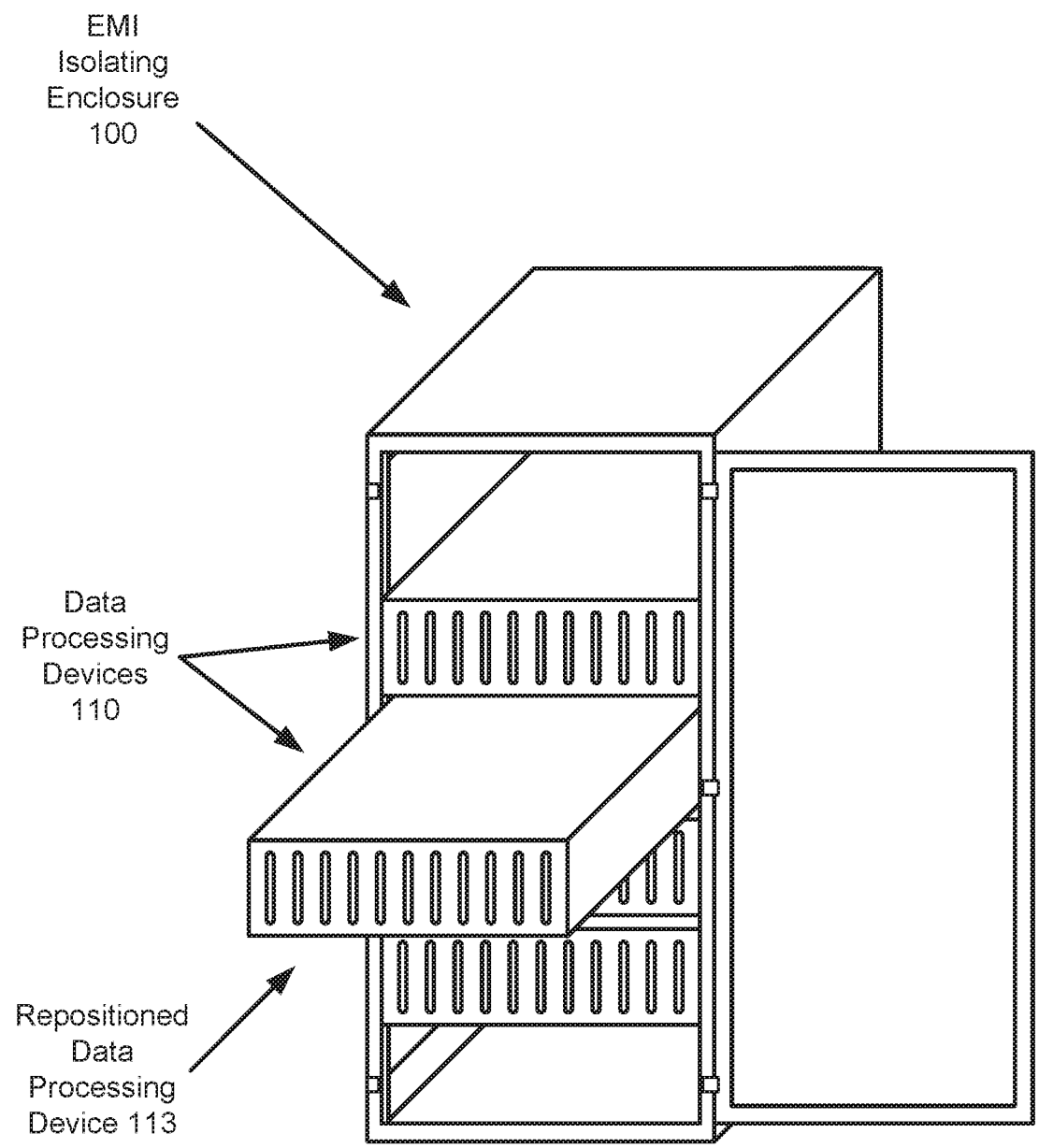
FIG. 1.3

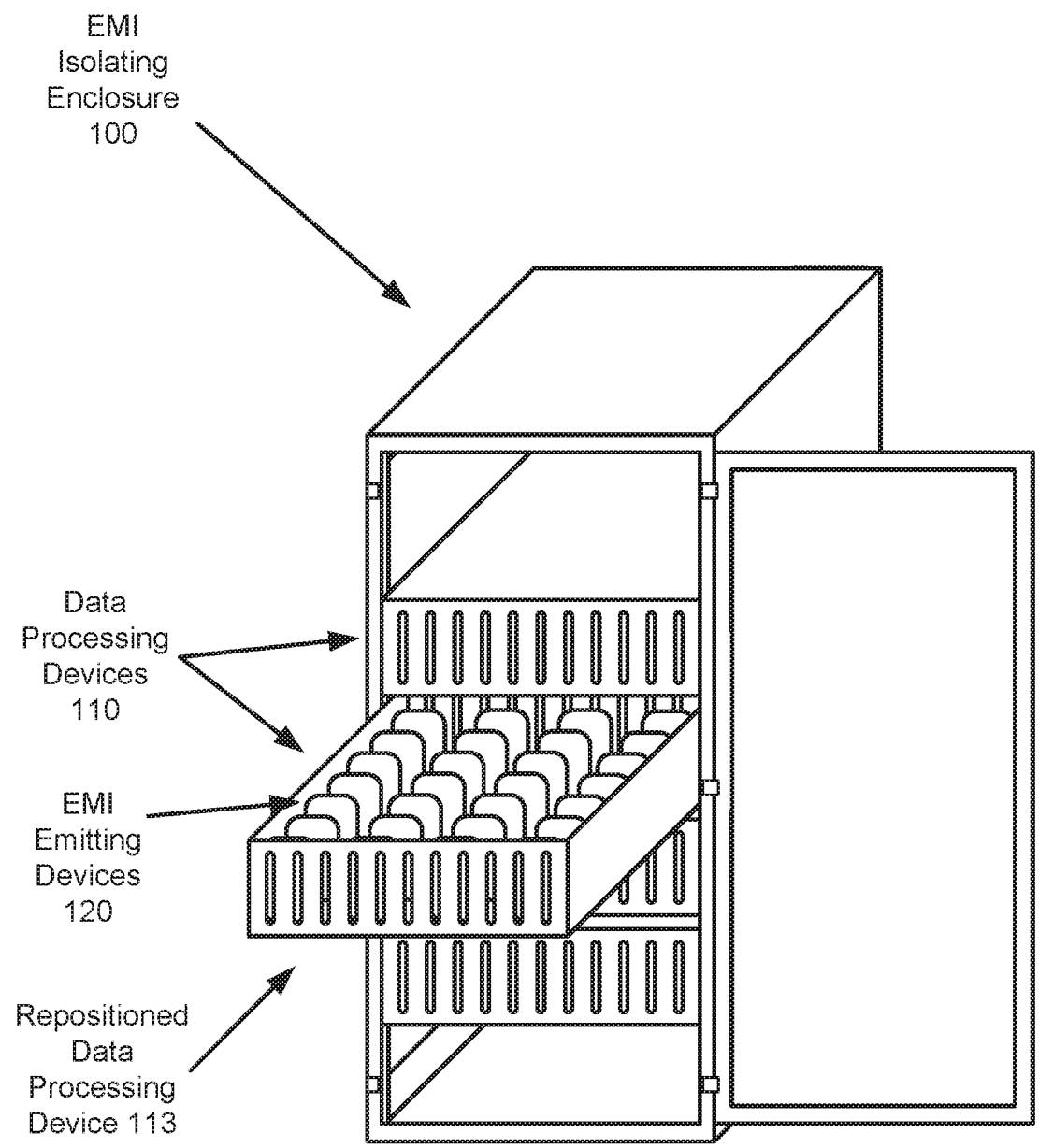
FIG. 1.4

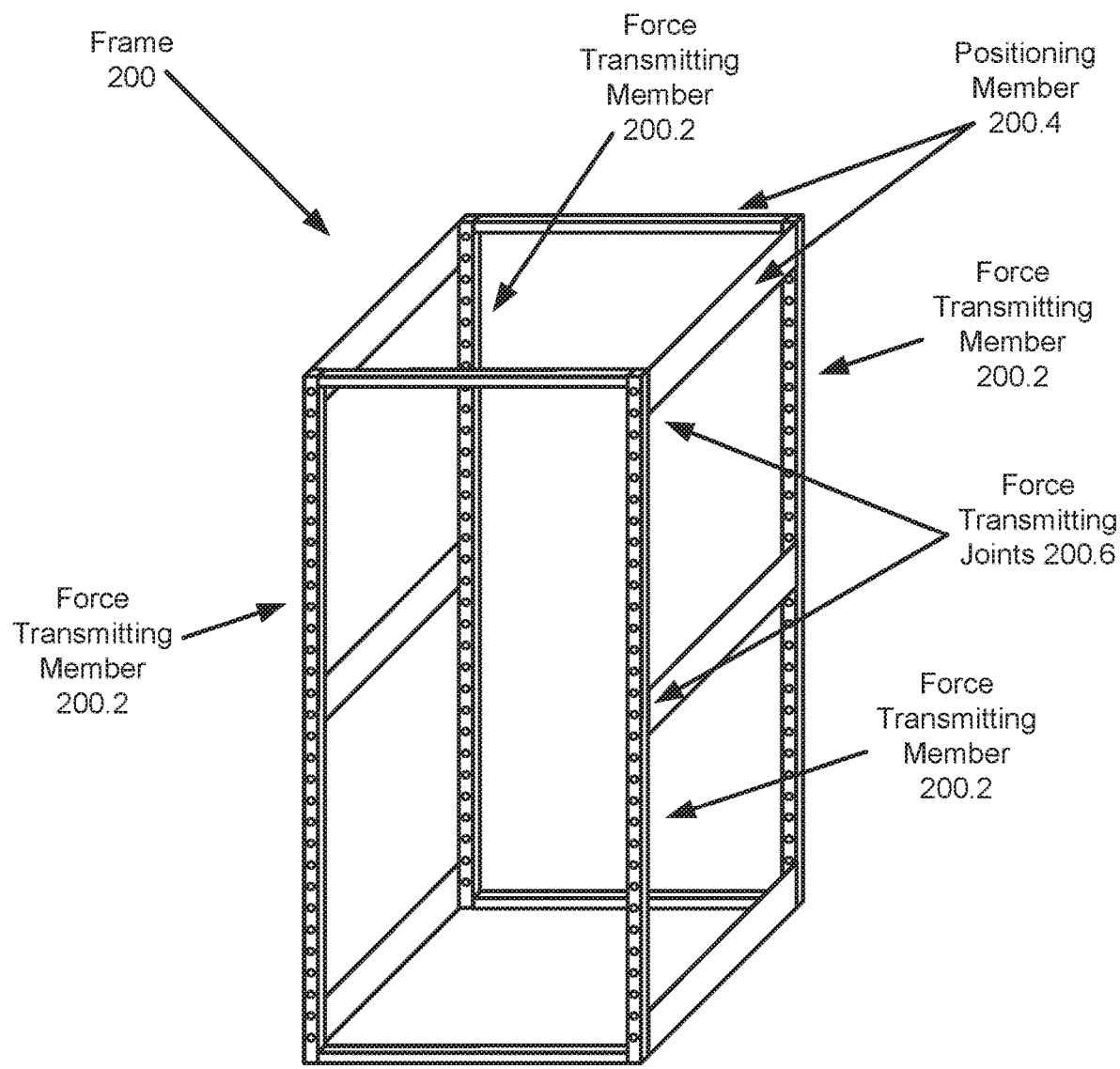
FIG. 2.1

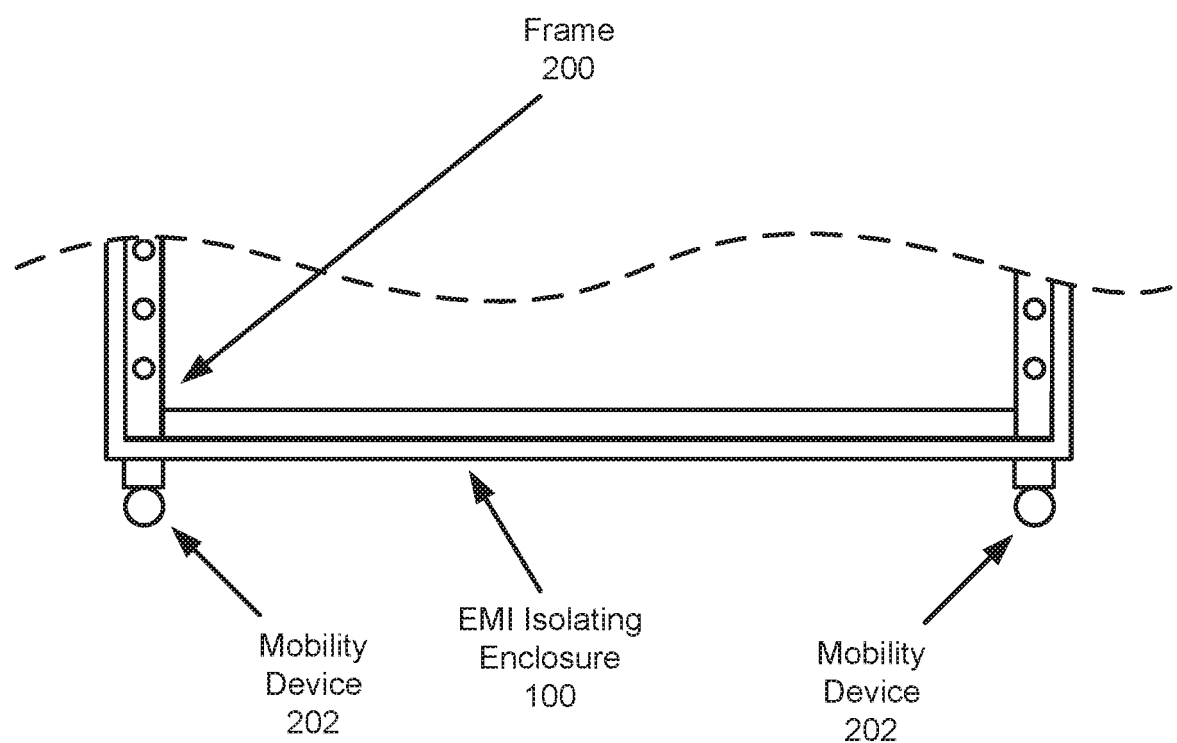
FIG. 2.2

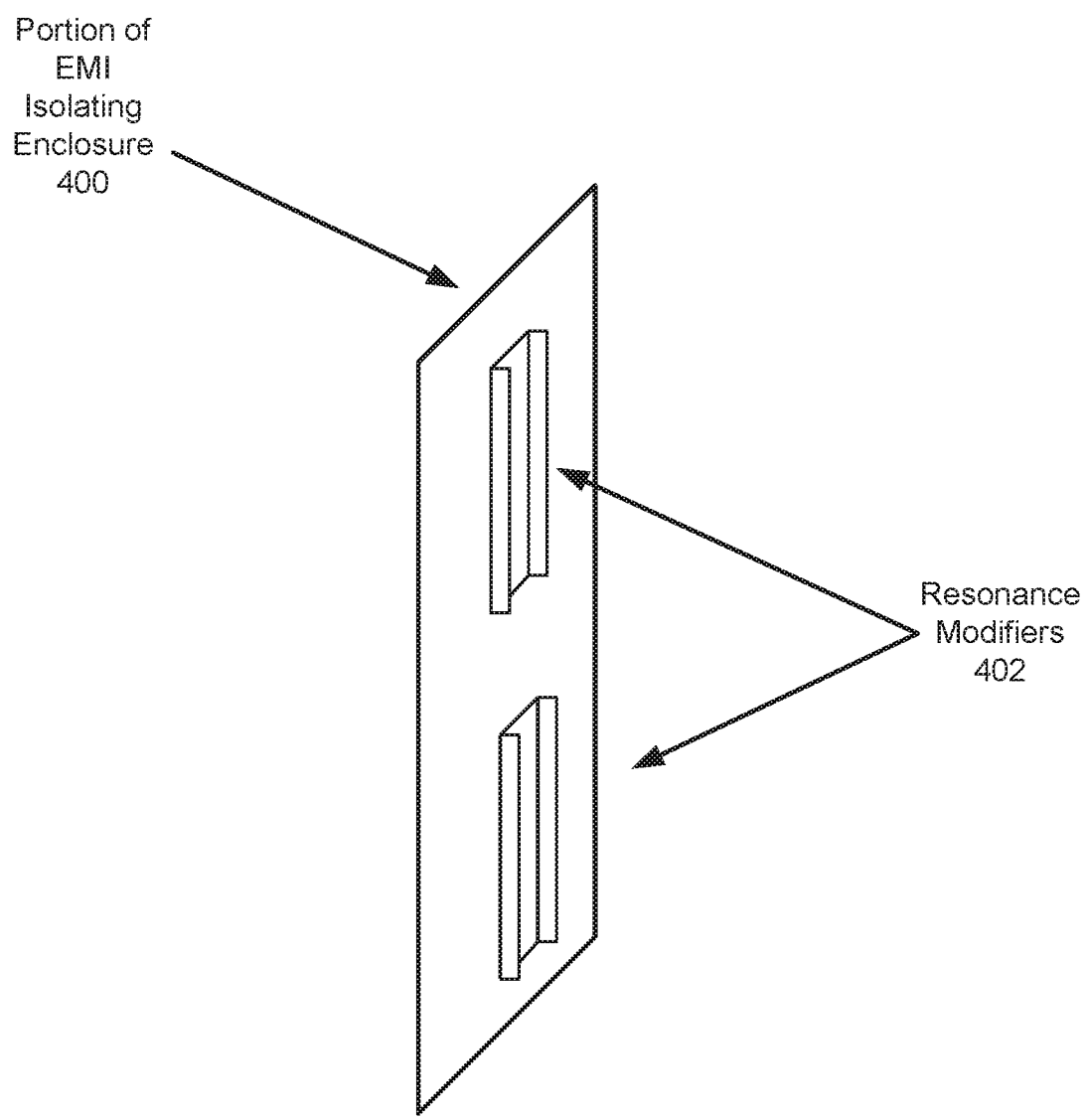
FIG. 4.1

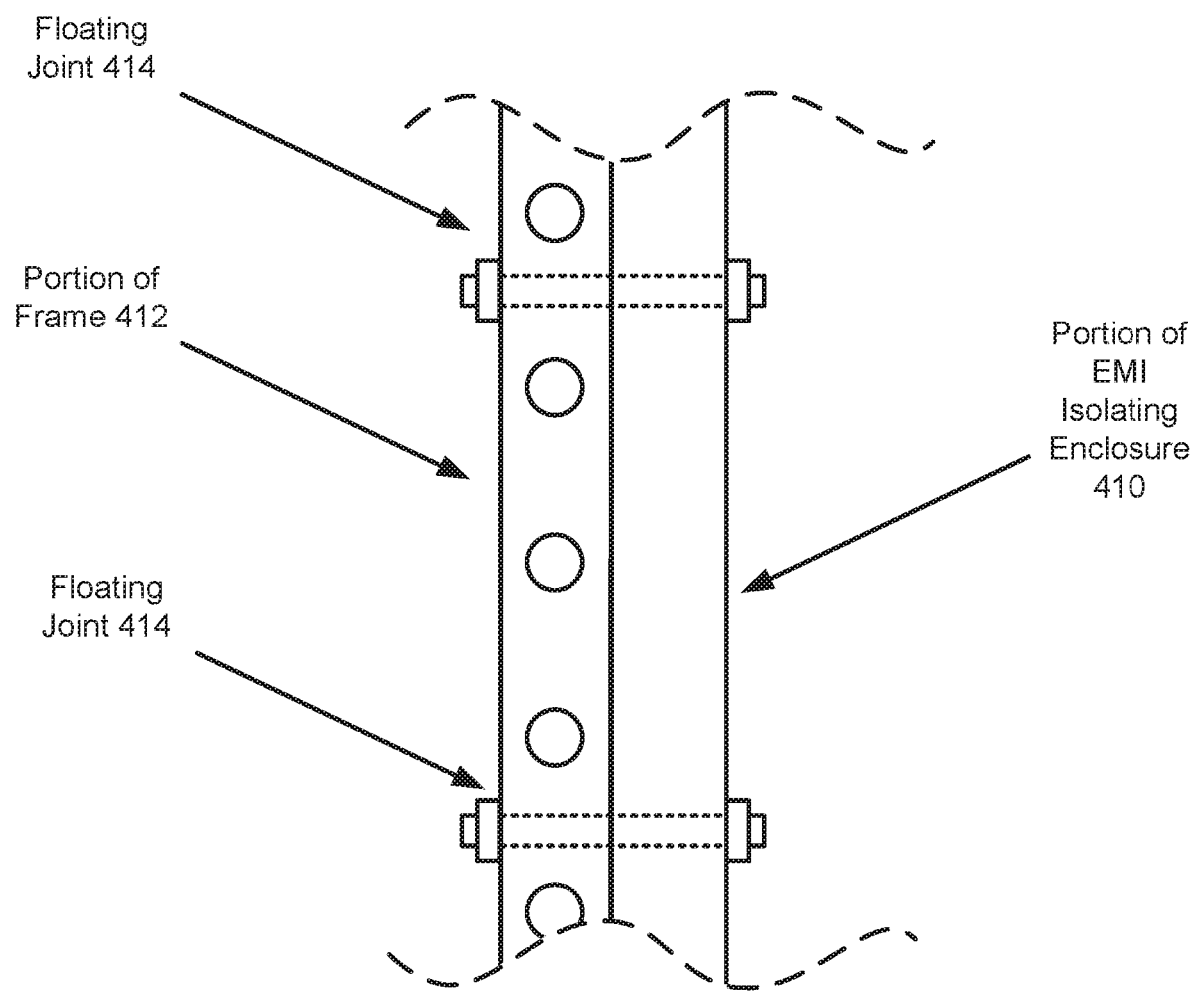
FIG. 4.2

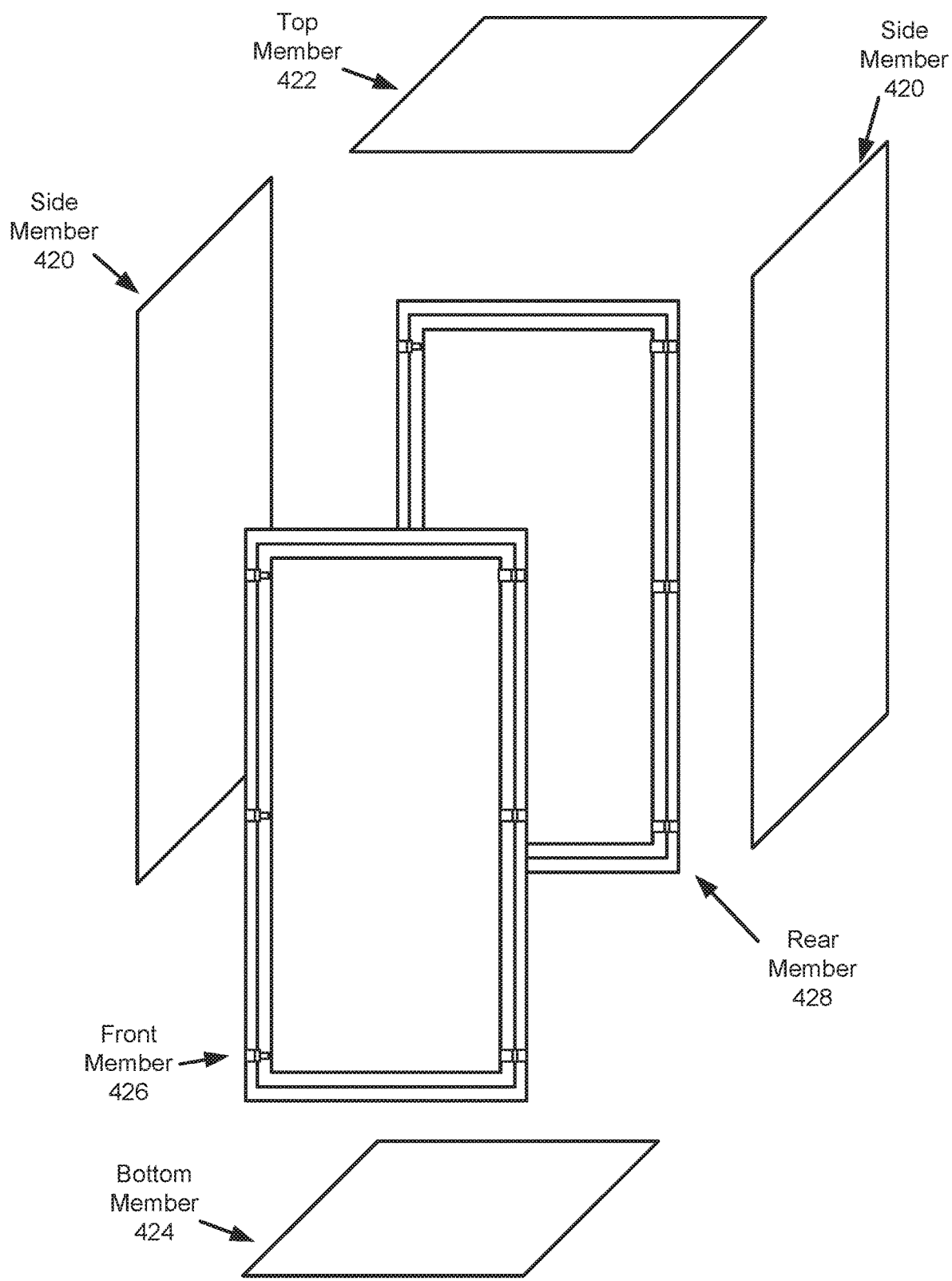
FIG. 4.3

SYSTEM AND METHOD FOR MANAGING ELECTROMAGNETIC INTERFERENCE

BACKGROUND

Multiple computing devices may be integrated into a predetermined area. For example, multiple computing devices may be included in a data center to provide the data center with more computational resources for performing one or more functionalities. When integrated into a predetermined area, the multiple computing devices may be close to one another.

SUMMARY

In one aspect, a housing device for isolating electromagnetic interference (EMI) emitting devices in accordance with one or more embodiments of the invention includes a structural frame for housing the EMI emitting devices. The housing device further includes a non-structural EMI isolating enclosure for encapsulating the structural frame.

In one aspect, a system in accordance with one or more embodiments of the invention includes a first housing device for housing data processing devices and a second housing device for isolating electromagnetic interference (EMI) emitting devices. The second housing device includes a structural frame and a non-structural EMI isolating enclosure.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of a system in accordance with one or more embodiments of the invention.

FIG. 1.2 shows a diagram of the example system of FIG. 1.1 in a second configuration in accordance with one or more embodiments of the invention.

FIG. 1.3 shows a diagram of the example system of FIG. 1.2 in a third configuration in accordance with one or more embodiments of the invention.

FIG. 1.4 shows a diagram of the example system of FIG. 1.3 in a fourth configuration in accordance with one or more embodiments of the invention.

FIG. 2.1 shows a diagram of a frame in accordance with one or more embodiments of the invention.

FIG. 2.2 shows a second diagram of the frame in accordance with one or more embodiments of the invention.

FIG. 4.1 shows a diagram of a portion of an electromagnetic interference isolating enclosure in accordance with one or more embodiments of the invention.

FIG. 4.2 shows a diagram of a joint in accordance with one or more embodiments of the invention.

FIG. 4.3 shows a diagram of multiple portions of an electromagnetic interference isolating enclosure in accordance with one or more embodiments of the invention.

DETAILED DESCRIPTION

Figure 3:
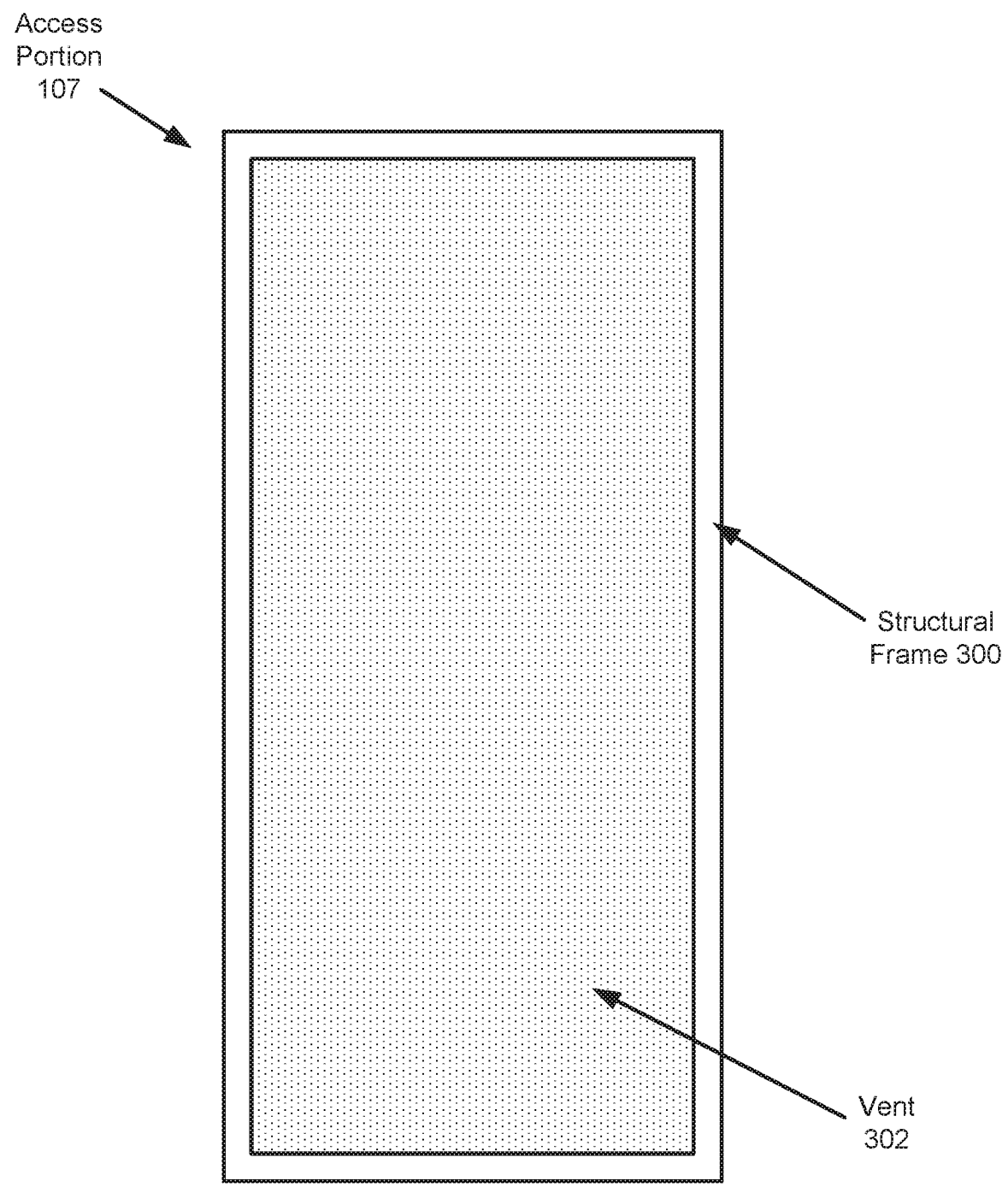
FIG. 3 shows a diagram of an access portion in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing Electromagnetic Interference (EMI). Devices may generate EMI as part of their operation. In a computing environment, EMI may negatively impact the operation of different devices within the environment.

A system in accordance with one or more embodiments of the invention may provide rack level EMI isolation for EMI emitting devices. The system may include a non-structural EMI isolating enclosure attached to a structural frame. The non-structural EMI isolating enclosure may be adapted to provide EMI management services to devices disposed within the EMI isolating enclosure. The frame may provide structure management services to the EMI isolating enclosure and/or other devices disposed within the EMI isolating enclosure. Structure management services may include, for example, positioning devices, orienting devices, and/or receiving stress/forces from the EMI isolating enclosure and/or other devices to prevent the EMI isolating enclosure and/or the other devices from repositioning, reorienting, deforming, or otherwise changes in response to stress/forces being applied.

By including a non-structural EMI isolating enclosure, a system in accordance with embodiments of the invention may be of lower weight when compared to contemporary systems, be capable of more efficient transportation, and/or may be compatible with high density computing environment by providing high accuracy mechanical interconnectivity via the frame while providing EMI isolation services.

FIG. 1.1 shows an example system, e.g., a housing device (10), in accordance with one or more embodiments of the invention. The system may include an electromagnetic interference (EMI) isolating enclosure (100). The EMI isolating enclosure (100) may be a device for electromagnetically isolating devices disposed within the EMI isolating enclosure (100) from an ambient environment around the EMI isolating enclosure (100).

For example, one or more electromagnetic interference emitting devices may be disposed within the EMI isolating enclosure (100). The system illustrated in FIG. 1.1 may manage the electromagnetic interference generated by the one or more electromagnetic interference emitting devices by (i) limiting the space in which electromagnetic interference is allowed to freely propagate and/or (ii) attenuating the electromagnetic interference as it propagates out of the limited space. The limited space may be, for example, an interior of the EMI isolating enclosure (100).

To do so, the system of FIG. 1.1 may reduce the strength of the electromagnetic interference (i.e., electromagnetic radiation) when propagating from inside the EMI isolating enclosure (100) to an ambient environment around the EMI isolating enclosure (100) and/or other locations by at least 90 decibels or another suitable level of isolation. The electromagnetic interference isolation provided by the EMI isolating enclosure (100) may have a frequency dependent response. For example, the EMI isolating enclosure (100) may provide at least 90 decibels, or another suitable level of isolation, across a frequency band in which devices that may be disposed within the EMI isolating enclosure (100) are adapted to emit electromagnetic interference. In other frequency bands, the EMI isolating enclosure (100) may provide different levels or no electromagnetic interference isolation for devices disposed within the EMI isolating enclosure (100).

Accordingly, an EMI isolating enclosure (100) in accordance with one or more embodiments of the invention may provide electromagnetic interference suppression and/or isolation services that are frequency dependent. In one or more embodiments of the invention, an EMI isolating enclosure (100) provides electromagnetic interference isolation by reducing the strength of electromagnetic interference across at least one frequency band by a predetermined amount (e.g., 90 decibels, 75 decibels, 60 decibels, 30 decibels, etc.). The frequency band may be associated with the devices that generate the electromagnetic interference.

An EMI emitting device may be any type of hardware device that intentionally emits electromagnetic radiation as part of its operation. The emissions of electromagnetic radiation may be, for example, continuous, periodic, or intermittent (e.g., at any point in time based on the operation of the respective EMI emitting device). An EMI emitting device may be, for example, a personal electronic device such as a cellular device (e.g., smart phone, cell phone, etc.), a personal computer (e.g., any type of computing device with wireless communications capabilities such as a tablet computer, a laptop computer, etc.), a watch (e.g., a wireless smart watch), or any other type of hardware device that intentionally emits electromagnetic radiation for any purpose (e.g., communications, detection, etc.).

The electromagnetic interference emitted by an electromagnetic interference emitting device may be frequency dependent. That is, the electromagnetic interference emitted. By the electromagnetic interference emitting device may be stronger in a first frequency band and weaker in a second frequency band (or may have different frequency dependencies). To provide electromagnetic interference suppression services, a EMI isolating enclosure (100) in accordance with one or more embodiments of the invention may attenuate the electromagnetic interference emitted by an electromagnetic interference emitting device by at least a predetermined amount (e.g., 90 decibels or another suitable level) across at least one frequency band in which the electromagnetic interference emitting device emits electromagnetic interference. The at least one frequency band may be, for example, the frequency band in which the emitted electromagnetic interference has a largest magnitude.

In one or more embodiments of the invention, an electromagnetic interference emitting device emits electromagnetic interference having frequency content between 700 megahertz and 10 gigahertz. An electromagnetic interference emitting device may emit electromagnetic interference having different frequency content without departing from the invention.

To further discuss aspects of embodiments of the disclosed technology, each component of the system of FIG. 1.1 is discussed below.

The EMI isolating enclosure (100) may be a physical device. The EMI isolating enclosure (100) may include any number of portions that bound one or more interior volumes. The portions of the EMI isolating enclosure (100) may electromagnetically isolate the one or more interior volumes by at least 90 decibels or another suitable level of isolation from the other interior volumes and/or the ambient environment surrounding the EMI isolating enclosure (100).

The portions of the EMI isolating enclosure (100) may include, for example, a top (102), a side (104), a front (106), and a bottom (108). The portions may also include a rear (not shown) and a second side (not shown). The aforementioned portions may delineate an interior volume of the EMI isolating enclosure (100) from an ambient environment.

Each of the portions of the EMI isolating enclosure (100) may have a structure that prevents, limits, and/or attenuates electromagnetic radiation that attempts to propagate through the respective portions by at least 90 decibels. By doing so, the portions of the EMI isolating enclosure (100) may electromagnetically isolate the interior volume from an ambient environment (and/or other portion/volumes of the EMI isolating enclosure (100)).

To prevent, limit, and/or attenuate electromagnetic radiation, each of the portions may have a shape and/or be made of a material that is adapted to interact with electromagnetic radiation in a manner that limits the ability of electromagnetic radiation from propagating through the respective portions.

For example, a first portion (e.g., top (102)) of the EMI isolating enclosure (100) may include a planar sheet (or other shape) of high conductivity material (e.g., aluminum, copper, brass, steel, etc.). The planar sheet may have a thickness that, in combination with the high conductivity of the planar sheet, prevents electromagnetic radiation from propagating through the portion resulting in the electromagnetic radiation being reflected back into an interior volume (where it may be absorbed by one or more structures disposed within the interior volume).

In another example, a second portion (e.g., side (104)) of the EMI isolating enclosure (100) may include a planar sheet (or other shape) of lossy material (e.g., carbon loaded polymer, etc.). The planar sheet may have a thickness that, in combination with the lossy material of the planar sheet, absorbs electromagnetic radiation as it propagates through the portion resulting in the electromagnetic radiation being transformed into heat via absorption.

In a further example, a third portion (e.g., second side (not shown)) of the EMI isolating enclosure (100) may include a planar sheet (or other shape) of conductive and lossy material (e.g., metal particle and carbon particle loaded polymer, etc.). The planar sheet may have a thickness that, in combination with the conductive and lossy material of the planar sheet, absorbs and/or reflects electromagnetic radiation as it attempts to propagate through the portion resulting in some of the electromagnetic radiation being transformed into heat via absorption and the remainder being reflected into the interior volume.

In one or more embodiments of the invention, the portions of the EMI isolating enclosure (100) are non-structural. For example, the portions of the EMI isolating enclosure (100) may not be adapted to receive loads from devices or other components disposed within the EMI isolating enclosure (100), other portions of the EMI isolating enclosure (100), and/or other devices/structures disposed outside of the EMI isolating enclosure (100). Thus, the portions of the EMI isolating enclosure (100) may provide EMI isolation services without providing structure management services (e.g., receiving/transmitting loads/pressures).

In one or more embodiments of the invention, the portions of the EMI isolating enclosure (100) may be physically connected by unstressed joints (e.g., 109). An unstressed joint may be a physical component that is adapted to provide EMI isolation services but not structure management services. For example, the unstressed joints (109) may be formed of conductive material, such as metal, but may not be adapted to transmit forces/stresses on the EMI isolating enclosure (100). Thus, the unstressed joints (e.g., 109) may be subject to failure if force/stresses are applied to the unstressed joints in a manner consistent with structure management services (e.g., transmitting loads/stresses/forces through the unstressed joint to maintain the structure of the EMI isolating enclosure (100) and/or other devices disposed within the EMI isolating enclosure (100)).

To maintain the structure of the EMI isolating enclosure (100), a frame may be disposed within the EMI isolating enclosure (100). The frame may be a structural component that provides structure management services to the EMI isolating enclosure (100) and/or other devices. For example, the portions of the EMI isolating enclosure (100) may be physically attached to the frame in a manner that preferentially causes loads/stresses/forces from the EMI isolating enclosure (100) to be transmitted to the frame rather than through the unstressed joints. By doing so, unstressed joints may be shielded from stresses that may damage/degrade the ability of the unstressed joints to provide IMI isolation services. For additional details regarding frames, refer to FIG. 2.1.

For example, stresses placed on the unstressed joints may lead to cracking or other changes in the physical structure of the EMI isolating enclosure (100) that enables electromagnetic radiation to propagate through the EMI isolating enclosure (100) without being attenuated. By transmitting forces applied to the portions of the EMI isolating enclosure (100) through the frame (rather than through the unstressed joints or other portions of the EMI isolating enclosure) the likelihood of changes in the structure of the unstressed joints resulting in propagation of EMI through the unstressed joints (e.g., 109) may be reduced.

The EMI isolating enclosure (100) may also include an access portion (107). The access portion (107) may enable an interior volume of the EMI isolating enclosure (100) to be accessed. For example, the access portion (107) may be a structure that enables the EMI isolating enclosure (100) to be sealed when the access portion (107) is in a first state and unsealed (e.g., open) when the access portion (107) is in a second state.

For example, the access portion (107) may be a door physically connected to the other portions of the EMI isolating enclosure (100) and/or other structures such as a frame via hinges (107.4) that enable the door to move between different states and latches (107.2) that enable the door to be reversibly fixed in a desired state (e.g., closed).

Additionally, the access portion (107) may enable the interior of the EMI isolating enclosure to be ventilated. For example, one or more portions of the access portion (107) may be gas permeable while still preventing/limiting the transmission of EMI through the access portion (107).

While only a single access portion (107) is illustrated in FIG. 1.1, an EMI isolating enclosure may include any number of access portions. For example, two access portions may be disposed on opposite portions (e.g., front (106) and a back/rear (not shown)) of the EMI isolating enclosure (100) to define a gas flow path through the interior of the EMI isolating enclosure. By doing so, the thermal state devices disposed within the EMI isolating enclosure (100) may be regulated through the flow of gasses through the gas flow path while preventing/limiting the transmission of EMI through the EMI isolating enclosure (100). For additional details regarding access portions, refer to FIG. 3.

While the system of FIG. 1.1 has been illustrated and described as including a limited number of specific components, a system in accordance with one or more embodiments of the invention may include additional, fewer, and/or different components without departing from the invention.

As discussed above, an EMI isolating enclosure (100) may provide electromagnetic interference management services for devices. To do so, the EMI isolating enclosure (100) may enable EMI emitting devices to be added to and/or removed from an interior volume bounded by the EMI isolating enclosure.

FIG. 1.2 shows a diagram of the system of FIG. 1.1 in a state in which devices may be added to or removed from an interior volume of the EMI isolating enclosure in accordance with one or more embodiments of the invention. Specifically, the access portion of the EMI isolating enclosure (100) has been moved from a first state in which the EMI isolating enclosure (100) is sealed to a second state in which the EMI isolating enclosure (1100) is unsealed.

To enable EMI emitting devices to be disposed within the EMI isolating enclosure (100), one or more data processing devices (1110) may be disposed within the EMI. isolating enclosure (100). A data processing device may be a physical structure for housing EMI emitting devices, computing devices, and/or other types of devices.

For example, a data processing device may include a chassis. The chassis may be adapted to receive devices and to physically attach to one or more portions of the system of FIG. 1.2, For example, the chassis may be adapted to physically attach to a frame to which the EMI isolating enclosure (100) is attached. As discussed above, a frame may be a structural component that provides structure management services to other devices (e.g., the EMI isolating enclosure (100) and/or the data processing devices (110)).

The data processing devices (110) may be attached to the frame in any manner. For example, the data processing devices (110) may be attached to the frame by, for example, rails, pins, bolts, etc.

FIG. 1.3 shows a diagram of the system of FIG. 1.2 in a state in which one of the data processing devices (110) has been repositioned with respect to the EMI isolating enclosure (100) in accordance with one or more embodiments of the invention. example, the repositioned data processing device (113) may have been repositioned using rails or another type of mechanism by which it is connected to the frame. By repositioning the data processing device, portions of the repositioned data processing device (113) that were inaccessible may be accessed.

FIG. 1.4 shows a diagram of the system of FIG. 1.3 in a state in which one of the portions of the repositioned data processing device (113) has been accessed in accordance with one or more embodiments of the invention. For example, the repositioned data processing device (113) may have been accessed by removing/repositioning a cover or other physical structure that defines a boundary of the repositioned data processing device (113). By removing/repositioning a portion of the data processing device, EMI emitting devices (120) disposed within the repositioned data processing device (113) may be accessed. For example, EMI emitting devices (120) may be added to and/or removed from the repositioned data processing device (113).

As discussed above, EMI emitting devices may be implemented using computing devices (and/or other types of devices that include computing devices may be disposed within the data processing devices (110)). For additional details regarding computing devices, refer to FIG. 5.

As discussed above, data processing devices may be attached to a frame, rather than an EMI isolating enclosure. By doing so, stresses/forces that may otherwise impact the ability of the EMI isolating enclosure to provide EMI isolation services may be mitigated by transmitting the forces through the frame rather than the EMI isolating enclosure. FIG. 2.1 shows a diagram of a frame (200) in accordance with one or more embodiments of the invention.

The frame (200) may be a physical structure that provides structure management services to the EMI isolating enclosure and/or other devices (e.g., data processing devices and/or other types of devices). For example, the frame (200) may receive stress/forces from devices attached to the frame (200) and transmit the stresses/forces in a manner that does not impact other components.

For example, the frame (200) may transmit forces/stresses that it receives to a structure upon which the frame (200) is disposed. For additional details regarding transmission of stresses from the frame to other devices, refer to FIG. 2.2.

To provide structure management services, the frame (200) may include any number of structural members. The structural members may form a structure upon which other components (e.g., EMI isolating enclosure) may be mounted to position the aforementioned components with respect to one another. For example, the portions of the EMI isolating enclosure may be disposed on the outside of the structural members thereby providing EMI isolation services to other devices attached to the frame (200).

The frame (200) may include one or more force transmitting members (e.g., 200.2). The force transmitting members may be adapted to receive forces/stresses transmitted to the frame (200) by other devices and transmit the received forces/stresses to other devices such as a structure upon which the frame is disposed. The frame (200) may do so directly or indirectly by transmitting the received forces/stresses through other structures. Refer to FIG. 2.2 for additional details regarding transmission of forces to other structures.

The force transmitting members (e.g., 200.2) may be, for example, tubular structures. The tubular structures may have a cross section (e.g., square, rectangular) that stiffens the force transmitting members. The force transmitting members (e.g., 200.2) may be of other shapes (and/or different force transmitting members may be of different shapes) without departing from the invention.

The frame (200) may include one or more positioning members (e.g., 200.4). The one or more positioning members (e.g., 200.4) may be adapted to maintain the relative positioning and/or orientation of the force transmitting members with respect to each other. For example, the one or more positioning members (e.g., 200.4) may be, for example, tubular structures. The tubular structures may have a cross section (e.g., square, rectangular) that stiffens the one or more positioning members (e.g., 200.4). The one or more positioning members (e.g., 200.4) may be of other shapes (and/or different force transmitting members may be of different shapes) without departing from the invention.

The one or more positioning members (e.g., 200.4) may be physically attached to the force transmitting members and/or other structures via force transmitting joints (200.6). The force transmitting joints (200.6) may enable forces/stresses to be transmitted between the force transmitting members and/or the positioning members. By doing so, the force transmitting members and/or the positioning members may provide structure management services by enabling forces/stresses applied to the frame (200) to be managed with minimal change to the relative positioning/orienting of the force transmitting members and/or the positioning members with respect to each other.

The frame (200) may further include any number of attachment points (illustrated as circles in FIG. 2.1). The attachment points may enable other structures (e.g., chassis of data processing devices, EMI isolating enclosure portions, etc.) to be attached to the frame (200). The attachment points may be any type of structure that enables other structures to be attached to the frame (200) using the attachment points. For example, one or more of the attachment points may be a hole through one of the members of the frame (200). The hole may be used to attach other structures to the frame using bolts or other types of attachment components (e.g., screws, wedges, pins, etc.).

In one or more embodiments of the invention, the frame (200) has a rectangular shape. For example, the components (e.g., 200.2, 200.4) of the frame may be arranged in a manner that defines a volume having a rectangular cross section of a predetermined length.

In one or more embodiments of the invention, the frame (200) is structural. For example, the components of the frame (200) may be adapted to maintain their position and/or orientation with respect to each other. In one or more embodiments of the invention, the frame (200) is a high precision structure. For example, the relative positioning of the force transmitting members (e.g., 200.2) may be of high accuracy (e.g., within 0.5 mm of a predetermined positioning tolerance). In contrast, the portions of the EMI isolating enclosure may not be structural and may be a low precision. For example, the relative positioning of the portions of the EMI isolating enclosure with respect to each other may be of low accuracy (e.g., within 3 mm of a predetermined positioning tolerance).

By doing so, the frame (200) may provide the positioning tolerances necessary to enable high precision devices such as a chassis of data processing devices to be mounted to the frame (200) while enabling the EMI isolating enclosure to be manufactured in a manner that decreases the likelihood of EMI propagating out of the EMI isolating enclosure without being attenuated (e.g., through a defect in a joint or other structure). For example, low precision manufacturing methods such as welding or joining portions by bolts (but have a high likelihood of preventing EMI propagation through the joint) may be utilized to attach the portions of the EMI isolating enclosure to each other and/or to the frame (200).

While the frame (200) is illustrated in FIG. 2.1 as including four force transmitting members and 10 positioning members, a frame (200) in accordance with one or more embodiments of the invention may include fewer and/or additional numbers of the aforementioned components without departing from the invention. Further, a frame (200) in accordance with one or more embodiments of the invention may include fewer, additional, and/or different components than those illustrated in FIG. 2.1.

As discussed above, the frame (200) may enable forces to be transmitted to other structures such as a platform upon which a system including a frame (200) is disposed. FIG. 2.2 shows a diagram of a portion of a frame (200) in accordance with one or more embodiments of the invention.

As seen from FIG. 2.2, a system in accordance with embodiments of the invention may include one or more mobility devices (e.g., 202). The mobility devices (e.g., 202) may be devices that enable forces to be transmitted by the frame (200) to other structures. The mobility devices may include, for example, casters, wheels, feet, or other types of structures that may enable forces to be transmitted to other devices (e.g., a surface upon which a housing device is disposed).

The one or more mobility devices (02) may be separated from the frame (200) by a portion of the EMI isolating enclosure (100). The members of the frame (200) may be attached to the mobility devices (202) in a manner that prevents forces from the frame (200) to impact the structural integrity of the portion of the EMI isolating enclosure separating the mobility devices from the frame. For example, the members of the frame (200) may be stacked directly on top of the mobility devices which enables stress/forces to be transmitted through the portion of the EMI isolating enclosure between the frame (200) and the mobility devices without tending to deform a shape of the portion of the EMI isolating enclosure.

In another example, the system may include adapters (not shown) that structurally reinforce the portion of the EMI isolating enclosure (100) through which forces from the frame (200) are transmitted to the mobility devices (e.g., 202). For example, plates that structurally reinforce portions of the EMI isolating enclosure (100) may be added. In such a scenario, the mobility devices (202) may not be stacked directly below the members of the frame (200). For example, the mobility devices may be offset from corresponding locations of members of the frame. The plates (or other physical structures) may enable forces to be transmitted to the offset mobility devices without negatively impacting the structure of the EMI isolating enclosure (200).

As noted above, a system may include an access portion that delineates a boundary of an EMI isolating enclosure. The access portion may enable an interior of the EMI isolating enclosure to be accessed. FIG. 3 shows a diagram of the access portion (107) in accordance with one or more embodiments of the invention.

The access portion (107) may include a structural frame (300) and a vent (302). The structural frame (300) may be a physical device for maintaining a shape of the access portion (107). For example, the structural frame (300) may include a rectangular sheet of metal (or other high conductivity material) with a hole corresponding to the vent (302). The conductivity of the structural frame (300) may provide EMI isolation services while the thickness and/or other features of the structural frame (300) may provide structure management services for the access portion (107).

The vent (302) may be a structure adapted to enable gasses to flow through it while providing EMI isolation services. For example, the vent (302) may include a sheet of metal (or other high conductivity material) with perforations that are of a shape, size, and thickness to prevent EMI from propagating through the perforations. For example, the perforations may have a thickness of 5 mm or greater, 7 mm or greater, 10 mm or greater, or another suitable thickness. The perforations may have a diameter of 10 mm or less, 7 mm or less, 5 mm or less, 3 mm or less, 1 mm or less, or another suitable diameter.

By doing so, the vent (302) may enable gasses to flow into/out of the interior volume of the EMI isolating vent while preventing/limiting EMI propagation out of the interior volume.

In one or more embodiments of the invention, the vent (302) is a structural member that enables forces applied to one portion of the structural frame (300) to be transmitted to another portion of the structural frame (300) through the vent (302). By doing so, the physical rigidity of the access portion may be greatly improved. Further, the size of the vent (302) may be made much larger without impacting the structural integrity of the access portion. For example, the vent (302) may be a continuous vent that covers a majority of the surface of the access portion (107). The majority may be, for example, greater than 75% of the surface, greater than 80% of the surface, greater than 85% of the surface, greater than 90% of the surface, or greater than 95% of the surface.

The structural integrity of the access portion (107) may provide it with the ability to reliably form electromagnetic seals between the access portion (107) and other structures. For example, if the access portion (107) deforms due to loads applied to various portions of the access portion (107), the access portion (107) may not be able to form an electromagnetic seal between it and the other portions of the EMI isolating enclosure. For example, minor deformations in the access portion (107) may create small gaps between the access portion (107) and the other portions of the EMI isolating enclosure. Such gaps may enable EMI to propagate out of the interior volume of the EMI isolating enclosure without being attenuated. Consequently, gaps or other deformation related changes in the structure of the access portion (107) may render the EMI isolating enclosure unable to provide EMI isolation services by failing to form an electromagnetic seal between it and another structure (e.g., other portions of the EMI isolating enclosure).

The structural frame (300) may be adapted to attach to the frame (e.g., 200, FIG. 2.1) in a manner that transmits forces/stresses on the structural frame (300) to the frame (e.g., 200, FIG. 2.1) rather than to other portions of an EMI isolating enclosure. For example, the structural frame (300) may be attached via hinges to one or more members of the frame (e.g., 200, FIG. 2.1). Doing so may prevent forces on the access portion (107) from causing other portions of the isolating enclosure from deforming when the access portion (107) is moved between its two states.

While the access portion has been described with respect to a limited number of specific components, an access portion in accordance with embodiments of the invention may include additional, fewer, and/or different components without departing from the invention. For example, an access portion in accordance with embodiments of the invention may include multiple, discrete vents that are separated from each other by non-vent structures (e.g., portions of the structural frame (300)).

As discussed above, a system in accordance with embodiments of the invention may include an EMI isolating enclosure. FIGS. 4.1-4.3 show diagrams of an EMI isolating enclosure, or portions thereof, in accordance with one or more embodiments of the invention.

FIG. 4.1 shows a diagram of a portion of an EMI, isolating enclosure (400) in accordance with one or more embodiments of the invention. The portion may correspond to any portion of the EMI isolating enclosure illustrated in FIG. 1.1. For additional details regarding the various portions of an EMI isolating enclosure, refer to FIG. 4.3.

As discussed above, the portions of the EMI isolating enclosure may include sheets of material that delineate boundaries of an internal volume of the EMI isolating enclosure. The sheets of material may be adapted to (i) prevent/attenuate propagating EMI as it propagates out of the interior volume, (ii) limit the forces applied to the frame (e.g., 200, FIG. 2.1) by being of a thickness/material capable of providing EMI isolation but not able to provide structure management, and/or (iii) be transported.

To be adapted for transportation, the portion of the EMI isolating enclosure (400) may include one or more resonance modifiers (402). A resonance modifier may be a structure adapted to modify a mechanical resonance of another structure. For example, when structures are excited via mechanical (e.g., acoustical) forces, the structures may resonate which may greatly increase the stresses/forces applied to the structures. The resonance modifiers (402) may be adapted to modify a resonance of the portion of the EMI isolating enclosure (400) outside of a frequency band in which a system may be subject to mechanical forces during transportation. The frequency band may be, for example, from 10-120 Hertz. The resonance modifiers (402) may modify a natural resonance of one of the components (e.g., a sheet of material) of the portion of the EMI isolating enclosure (400) to be outside of the frequency band associated with transportation.

The resonance modifiers (402) may be, for example, physical structures that have a natural resonance outside of the frequency hand associated with transportation. The physical structures may be, for example, portions of C channel, tubular members, or other physical structures that have a natural resonance substantially outside of the frequency band associated with transportation. When the resonance modifiers (402) are attached to the portion of the EMI isolating enclosure (400), the natural mechanical resonances of the combined structure may be outside of the frequency band associated with transportation.

Any portion of the EMI isolating enclosure may include any number and/or type of resonance modifiers. Different portions may include resonance modifiers with different characteristics (e.g., size, thickness, material, etc.).

in one or more embodiments of the invention, the resonance modifiers (402) may be compliant members. The compliant members may absorb or otherwise prevent mechanical vibrations to be transmitted to a portion of the EMI isolating enclosure, or another portion of the housing device. For example, the resonance modifiers (402) may be dampers disposed between the frame and a portion of the EMI isolating enclosure (400).

The resonance modifiers (402), by preventing the portion of the EMI isolating enclosure from resonating, may decrease the forces applied to other portions of the housing device due to resonance. For example, forces on the unstressed joints due to resonances of the portions of the EMI isolating enclosure (or other portions of the housing device) may be reduced and/or eliminated.

As discussed above, the portions of the EMI isolating enclosure may be non-structural in that the portions are not adapted to bear stress/forces from other structures. To arrange the portions of the EMI isolating enclosure with respect to each other, the portions of the EMI isolating enclosure may be physically attached to the frame. FIG. 4.2 shows a diagram of an attachment between a portion of the EMI isolating enclosure (410) and a portion of the frame (412).

The attachments between the portion of the frame (412) and the portion of the EMI isolating enclosure (410) may be made using one or more floating joints (e.g., 414). A floating joint may be a type of physical connection that enables a low accuracy structure to be attached to a high accuracy structure while enabling forces/stresses to be transmitted via the physical connections. By being connected via floating joints, the frame may be able to meet the high precision tolerances of devices to be disposed in the frame while also allowing the EMI isolating enclosure to be attached to the frame without negatively impacting the accuracy provided by the frame.

For example, a floating joint (414) may be a physical joint between two structures that assumes there will be some mismatch in the positioning of features on the two structures that enable a physical joint to be made between the structures. For example, as illustrated in FIG. 4.2, multiple joints may be employed to position/orient portions of an EMI isolating enclosure. However, because of the low accuracy nature of the EMI isolating enclosure, holes that enable the EMI isolating enclosure to be attached to the frame by using, for example, bolts (or other types of interconnection devices such as screws, wedges, etc.), may be spaced further apart or closer together than corresponding holes on the frame. To address this potential issue, the holes on the portion of the frame (412) and/or the portion of the EMI isolating enclosure (410) may be oversized, have an oval shape, or may otherwise include a mechanism for taking into account the mismatch in the positioning of the holes (or other types of structures for enabling two structures to be physically connected). By doing so, stresses/forces applied to the frame by the portion of the IMI isolating enclosure (410) due to the physical attachment may be reduced, mitigated, or otherwise minimized.

As noted above, the EMI isolating enclosure may be formed of multiple members. FIG. 4.3 shows a diagram of members of an EMI isolating enclosure in accordance with one or more embodiments of the invention.

An EMI isolating enclosure may include, for example, six members that define the boundary of a rectangular volume. The six members may be, for example, a top member (422), a bottom member (424), two side members (e.g., 420), a front member (426), and a rear member (428).

To form the EMI isolating enclosure, the members of the EMI isolating enclosure may be electrically connected to each other via unstressed joints, as illustrated in FIG. 1.1. When connected to each other, at least two of the members (e.g., front member (426) and rear member (428)) may include access portions. The included access portions may define a gas flow path through an interior of the EMI isolating enclosure. By including a continuous vent in at least one of the access portions, showing effects on the flow of gas through the interior volume may be greatly reduced when compared to access portions that include multiple, discrete vents.

For example, access portions that include multiple, discrete vents may generate turbulent flows of gas and/or may cause shadow regions inside the interior volume to form that have greatly reduced gas flow rates within the shadow regions. Such shadow regions may prevent or otherwise limit the ability of components disposed within the interior volume to be cooled via the flow of gas through the interior volume. Consequently, inclusion of at least one continuous vent may improve the ability of the system to provide thermal management services (e.g., cooling via gas flow) to components disposed within the internal volume while the components are EMI isolated by the EMI management services provided by the system.

Figure 5:
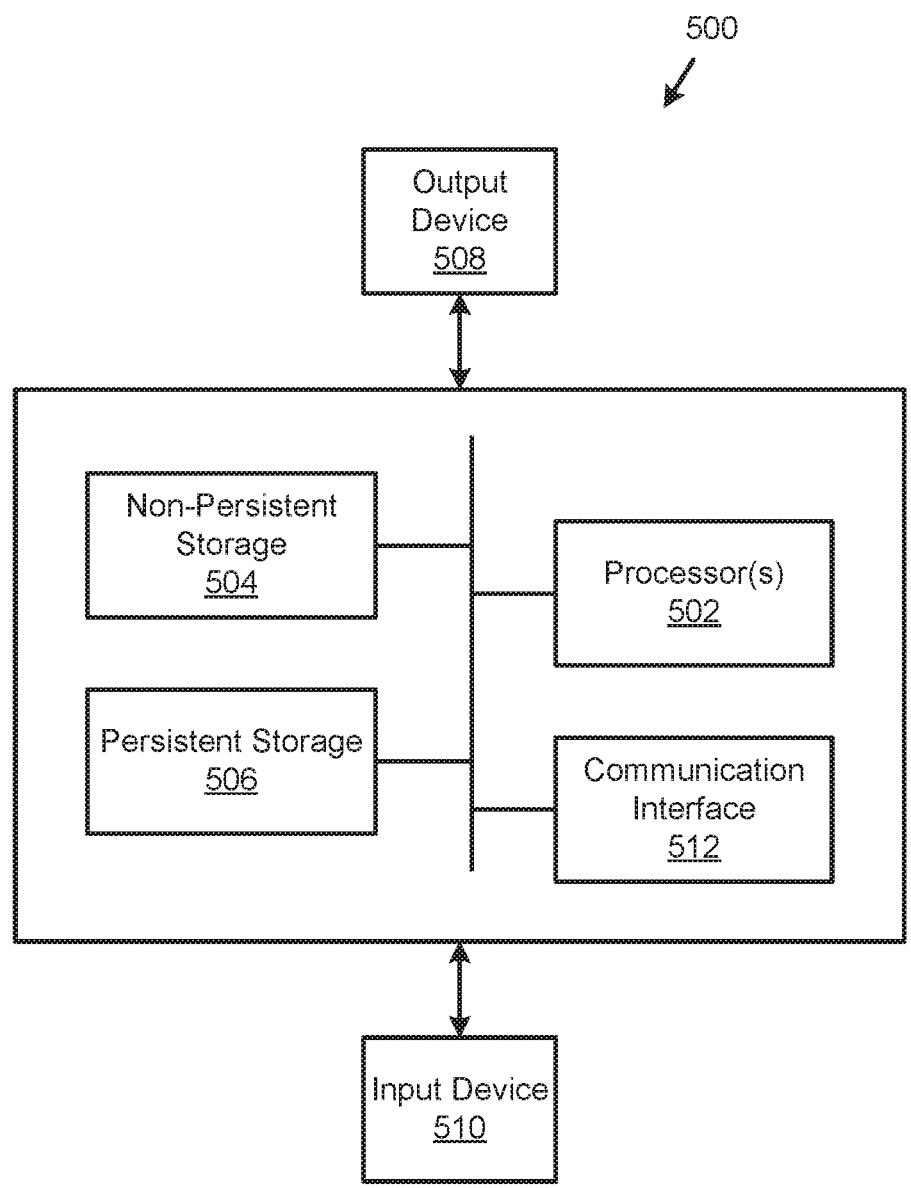
FIG. 5 shows a diagram of a computing device in accordance with one or more embodiments of the invention.

As discussed above, embodiments of the invention may be implemented using computing devices. FIG. 5 shows a diagram of a computing device in accordance with one or more embodiments of the invention. The computing device (500) may include one or more computer processors (502), non-persistent storage (504) (e.g., volatile memory, such as random access memory (RAM), cache memory), persistent storage (506) (e.g., a hard disk, an optical drive such as a compact disk (CD) drive or digital versatile disk (DVD) drive, a flash memory, etc.), a communication interface (512) (e.g., Bluetooth interface, infrared interface, network interface, optical interface, etc.), input devices (510), output devices (508), and numerous other elements (not shown) and functionalities. Each of these components is described below.

In one embodiment of the invention, the computer processor(s) (502) may be an integrated circuit for processing instructions. For example, the computer processor(s) may be one or more cores or micro-cores of a processor. The computing device (500) may also include one or more input devices (510), such as a touchscreen, keyboard, mouse, microphone, touchpad, electronic pen, or any other type of input device. Further, the communication interface (512) may include an integrated circuit for connecting the computing device (500) to a network (not shown) (e.g., a local area network (LAN), a wide area network (WAN) such as the Internet, mobile network, or any other type of network) and/or to another device, such as another computing device.

In one embodiment of the invention, the computing device (500) may include one or more output devices (508), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (502), non-persistent storage (504), and persistent storage (506). Many different types of computing devices exist, and the aforementioned input and output device(s) may take other forms.

Embodiments of the invention may provide methods, devices, and/or systems for managing EMI. Specifically, embodiments of the invention may provide a structure for managing EMI at a rack level. By directly integrating a non-structural EMI isolating enclosure with a structural frame, a compact system capable of being used in a high density computing environment may be provided. By using a non-structural EMI isolating enclosure, a low-weight, low precision structure may be utilized in combination with a high precision, load bearing frame to provide rack level EMI isolation in a manner that is compatible with weight, size, power, thermal management, and other requirements of high density computing environments.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A housing device for isolating electromagnetic interference (EMI) emitting devices, comprising:
 a structural frame for housing the EMI emitting devices; and
 a non-structural EMI isolating enclosure for encapsulating the structural frame,
 wherein the non-structural EMI isolating enclosure electrically isolates the EMI emitting devices from an ambient environment by at least 90 decibels, and
 wherein the non-structural EMI isolating enclosure comprises:
  portions physically connected by unstressed joints between the portions,
  wherein each of the portions comprises a sheet of conductive material, and
  wherein at least one of the portions comprises a resonance modifier adapted to modify a mechanical resonance of the at least one of the portions outside a frequency range of 10 to 120 Hertz such that the at least one of the portions is transported without being affected by mechanical forces applied to the at least one of the portions during a transportation of the housing device.

2. The housing device of claim 1, further comprising:
 a mobility unit, coupled to the structural frame, adapted to receive force transmitted from the structural frame.

3. The housing device of claim 1, where the structural frame comprises:
 a force transmitting member adapted to:
  receive a chassis for housing a portion of the EMI emitting devices; and
  support a portion of the non-structural EMI isolating enclosure.

4. The housing device of claim 3, wherein the structural frame further comprises:
 a positioning member adapted to position the force transmitting member with respect to a second force transmitting member of the structural frame,
 wherein the portion of the non-structural EMI isolating enclosure does not position the force transmitting member.

5. The housing device of claim 3, wherein the portion of the non-structural EMI isolating enclosure is attached to a second portion of the non-structural EMI isolating enclosure via an unstressed joint.

6. The housing device of claim 5, wherein the unstressed joint electrically connects the portion of the non-structural EMI isolating enclosure to the second portion of the non-structural EMI isolating enclosure.

7. The housing device of claim 3, wherein the portion of the non-structural EMI isolating enclosure is supported by the force transmitting member via a floating joint.

8. The housing device of claim 7, wherein the floating joint enables the portion of the non-structural EMI isolating enclosure to transmit force on the portion of the non-structural EMI isolating enclosure to the structural frame.

9. The housing device of claim 8, wherein transmitting the force on the portion of the non-structural EMI isolating enclosure to the structural frame places a joint between the portion of the non-structural EMI isolating enclosure and a second portion of the non-structural EMI isolating enclosure in an unstressed state.

10. The housing device of claim 1, wherein the unstressed joints between the portions electrically connect the portions to each other.

11. The housing device of claim 1, wherein the structural frame comprises:
   members physically connected to each other via force transmitting joints.

12. The housing device of claim 11, wherein the non-structural EMI isolating enclosure comprises:
   second members connected to each other via unstressed joints.

13. A system, comprising:
   a first housing device for housing data processing devices; and
   a second housing device for isolating electromagnetic interference (EMI) emitting devices,
      comprising:
      a structural frame; and
      a non-structural EMI isolating enclosure,
   wherein the non-structural EMI isolating enclosure electrically isolates the EMI emitting devices from an ambient environment by at least 90 decibels, and
   wherein the non-structural EMI isolating enclosure comprises:
      portions physically connected by unstressed joints between the portions,
      wherein each of the portions comprises a sheet of conductive material, and
      wherein at least one of the portions comprises a resonance modifier adapted to modify a mechanical resonance of the at least one of the portions outside a frequency range of 10 to 120 Hertz such that the at least one of the portions is transported without being affected by mechanical forces applied to the at least one of the portions during a transportation of the housing device.

14. The system of claim 13, wherein the non-structural EMI isolating enclosure electrically isolates the EMI emitting devices from the data processing devices by at least 90 decibels.

* * * * *